United States Patent
Dat

[19]

[11] Patent Number: 6,011,683
[45] Date of Patent: Jan. 4, 2000

[54] THIN MULTILAYER CERAMIC CAPACITORS

[75] Inventor: Rovindra Dat, Dallas, Tex.

[73] Assignee: Texas Instruments Incorporated, Dallas, Tex.

[21] Appl. No.: 09/016,239

[22] Filed: Jan. 30, 1998

Related U.S. Application Data

[60] Provisional application No. 60/036,326, Jan. 30, 1997.

[51] Int. Cl.⁷ .................................................. H01G 4/228
[52] U.S. Cl. ...................... 361/306.1; 361/309; 361/310; 361/313
[58] Field of Search ................................. 361/303, 306.1, 361/306.3, 307, 308.1, 309, 310, 311–313, 320, 321.1, 321.2, 321.3, 321.4, 329, 330; 257/301, 303

[56] References Cited

U.S. PATENT DOCUMENTS

| | | |
|---|---|---|
| 3,235,939 | 2/1966 | Rodriguez et al. |
| 4,082,906 | 4/1978 | Amin et al. .............................. 428/539 |
| 4,168,520 | 9/1979 | Coleman et al. ..................... 361/308.1 |
| 4,328,530 | 5/1982 | Bajorek et al. .......................... 361/308 |
| 4,356,529 | 10/1982 | Kopel ................................... 361/321.2 |
| 4,561,954 | 12/1985 | Scrantom et al. .................. 204/192 R |
| 4,605,835 | 8/1986 | Deffeyes ............................. 219/85 BM |
| 4,613,518 | 9/1986 | Ham et al. ................................. 427/38 |
| 4,734,818 | 3/1988 | Hernandez et al. ..................... 361/306 |
| 4,740,863 | 4/1988 | Langlois ................................... 361/309 |
| 4,741,077 | 5/1988 | Langlois .................................. 29/25.42 |
| 4,835,656 | 5/1989 | Kitahara et al. ......................... 361/321 |
| 4,852,227 | 8/1989 | Burks ..................................... 29/25.42 |
| 4,862,318 | 8/1989 | Galvagni et al. ........................ 361/321 |
| 5,040,092 | 8/1991 | Katho et al. ........................... 361/321.2 |
| 5,046,236 | 9/1991 | Wada et al. ............................ 29/610.1 |
| 5,319,517 | 6/1994 | Normura et al. .................... 361/321.4 |
| 5,335,139 | 8/1994 | Nomura et al. ...................... 361/321.2 |
| 5,461,014 | 10/1995 | Chu et al. ................................. 501/135 |
| 5,534,290 | 7/1996 | Rainwater et al. ........................ 427/97 |
| 5,687,055 | 11/1997 | Miki ....................................... 361/305 |

*Primary Examiner*—Kristine Kincaid
*Assistant Examiner*—Anthony Dinkins
*Attorney, Agent, or Firm*—Bret J. Petersen; Richard L. Donaldson

[57] ABSTRACT

An improved structure for a thin multilayer capacitor where the electrodes are formed only on a portion of the ends of the package to reduce the footprint on the circuit board and the amount of noble metal used for each unit. The improved structure results from a manufacturing method that has additional advantages of reduced fabrication costs and fewer manufacturing steps.

4 Claims, 2 Drawing Sheets

FIG. 4

THIN MULTILAYER CERAMIC CAPACITORS

This application claims priority under 35 USC § 119(e)(1) of provisional application Ser. No. 60/036,326, filed Jan. 30, 1997 now abandoned.

FIELD OF THE INVENTION

The present invention relates to monolithic multilayer capacitors and, in particular, to a structure and method of making end terminations for a monolithic multilayer capacitor.

BACKGROUND OF THE INVENTION

A monolithic multilayer capacitor includes a body portion, referred to herein as a "chip," and also includes a pair of end terminations. Such a capacitor has a stacked configuration having alternating conductive and dielectric layers, with the conductive layers defining first and second sets. These layers are contained in the chip. In the capacitor, all the conductive layers in the first set are electrically connected together at one end of the chip by one of the pair of end terminations; all the conductive layers in the second set are electrically connected together at the opposite end of the chip by the other of the pair of end terminations.

Various types of materials can be used to make a monolithic multilayer capacitor. When ceramic is used as the dielectric, the capacitor is referred to as a monolithic multilayer ceramic (MLC) capacitor. In a monolithic MLC capacitor, a platinum/palladium alloy is commonly used for the conductive layers. In other multilayer ceramic capacitors, any of various materials, including silver, gold, and platinum, is used for the conductive layers. In any case, the capacitor is functional only if at each of the opposite ends of the chip the respective end termination provides a good electrical connection to the edges of the conductive layers in the chip, such that all the conductive layers in one set cooperate as one electrode and all the conductive layers in the other set cooperate as another electrode.

One prior art approach that has been used to electrically connect such conductive layers together involves a liquid coating process. A representative example of this liquid coating process can be more particularly described in the concrete context of the manufacture of MLC capacitors. In this context, the prior art liquid coating process entails preparing an ink comprising silver and a glass frit for use as a coating material. In sequence, one end of the MLC chip is dipped into the ink, and later the opposite end is dipped into the ink. After dipping, the chip is placed in an oven and subjected to a firing cycle where the glass frit bonds to the ceramic and the silver in the ink mixture provides the electrical continuity and electrical termination joining the conductive layers within the chip and thus provides the end terminations for the resulting functional capacitor. A capacitor prepared in this manner can be used as a surface-mounted device; that is, the capacitor can be bonded to a printed circuit board by directly reflow soldering or by using conductive epoxy that electrically connects plated conductors on the board directly to the end terminations of the capacitor. Alternatively, a separate lead can be attached to the film at each end of the capacitor to provide a pair of leads for inserting into plated holes in a circuit board or for otherwise connecting the capacitor to the other electrical circuitry with which it is to be used.

In addition to the above-described process, the prior art includes U.S. Pat. No. 3,992,761. This patent discloses an approach to the problem in a production operation of providing an individual termination at each end of many multilayer capacitor chips. The disclosed approach is to mount the capacitor bodies in a support sheet and encapsulate the support sheet and the capacitor bodies in a plastic block with the ends of the capacitor body being exposed at opposed surfaces of the block. According to the disclosed approach, the exposed ends of the capacitor bodies are simultaneously plated via an electroless plating process with a termination film and then with a solder film and the terminated capacitor bodies are thereafter removed from the block.

In prior art surface-mounted capacitors, the end terminations not only cover the end of the chip but also forms a thin, surface contact adjacent the end, and often a complete band around the end of the chip. This was typically done for two reasons. First, during surface mounting of the capacitor, the solder will "float" the capacitor slightly above the board, thereby providing clearance beneath the bottom surface of the capacitor and allowing use of cleaning fluids to remove residual flux. Second, the capacitor can be made symmetrical so that it does not have to be specially oriented during the assembly operation preceding the soldering operation.

SUMMARY OF THE INVENTION

The present invention provides solutions and advantages over prior art process. One of the disadvantages of the prior art is the need for multiple firing operations. The chips are fired after being removed from the sheet, and again after coating the end termination.

Another problem relates to the expense involved in production operations such as the sequential ink-coating steps in which one end at a time of the MLC chip is dipped into the ink. These steps are not only time consuming but also difficult to carry out with miniature capacitors. The dimensions of such a miniature capacitor can be about 0.080" long, by 0.050" wide, by 0.050" thick. Another factor that adds to the cost of the capacitor is the cost of the noble metal, such as silver, that is used in the coating ink.

In accordance with the present invention, an improved method and the resulting structure is disclosed for MLC capacitors which require a single firing step and where the end terminations are fabricated prior to singulation and the electrodes may be sintered at the same time as the firing of the ceramic body of the MLC capacitors.

An advantage of the present invention is that the capacitors are completely fabricated prior to singulation.

An additional advantage of this invention is reduced fabrication costs and complexity by eliminating the additional handling and orientational alignment steps required for the application of the edge termination electrodes after singulation.

Another advantage of the present invention is that the capacitors have a reduced footprint on a printed circuit board as a consequence of the smaller contact pad compared to prior art device structures.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiments of the present invention are best understood by referring to FIGS. 1–7b of the drawings, like numerals are used for like and corresponding parts of the various drawings.

Figure 1:
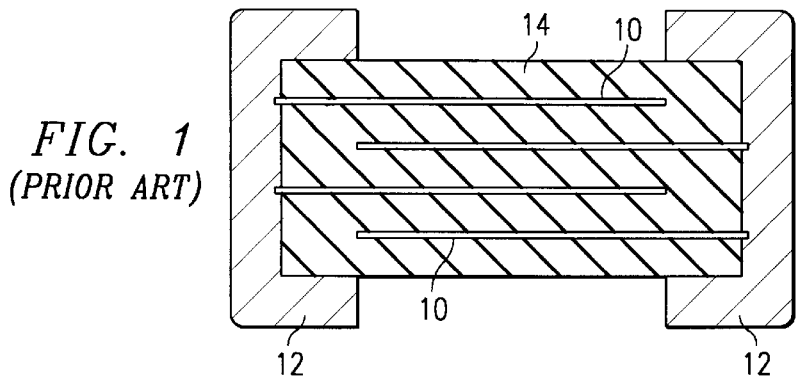
FIG. 1 Represents a cross-sectional view of a prior art MLC capacitor.
Figure 2:
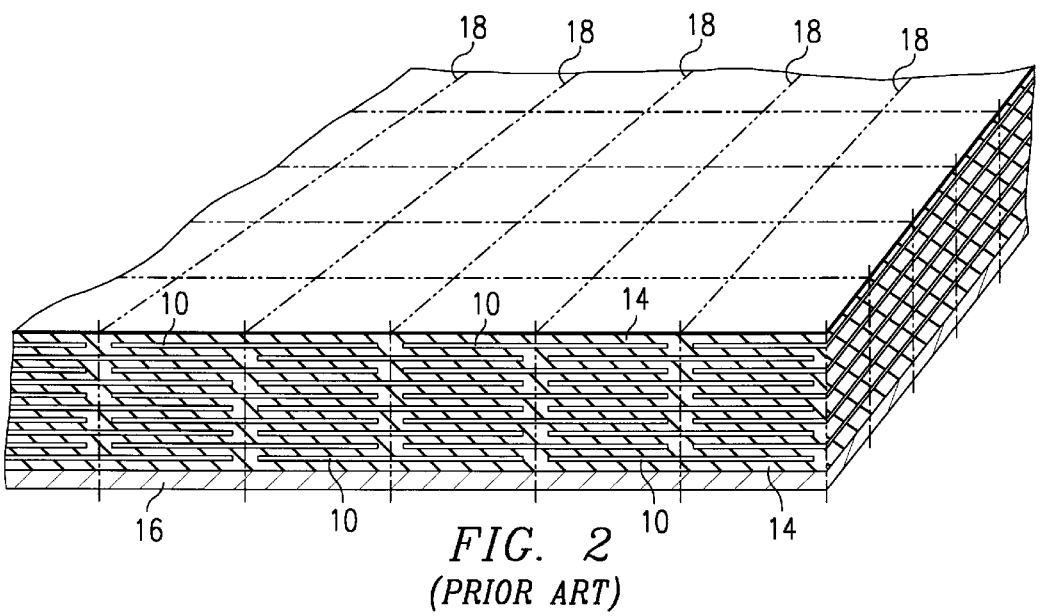
FIG. 2 Shows a sheet of capacitor layers formed on a base according to the prior art and also used in an embodiment of the present invention.

With reference to FIG. 1, there is shown a prior art MLC capacitor. In this typical prior art structure, alternating electrodes 10 contact end terminations 12 and are separated by a ceramic dielectric 14. FIG. 2 shows a second prior art MLC capacitor structure where multiple MLC capacitors being formed on a substrate 16 prior to singulation. Cut lines 18 are shown which indicate where the individual capacitors will be cut from the structure. According to this prior art method and structure, end terminations to the electrodes would be formed after singulation as described below.

The prior art process typically includes the following steps. First, layers of a dielectric ceramic material 14 (produced by the doctor blade tape-casting approach or the waterfall coating process) are interleaved with layers of a conducting metallic material (deposited by screen-printing) on a carrier plate or substrate 16. The latter facilitates mechanization of the multilayer buildup and the subsequent cutting process for singulated capacitors. The printing of the electrode material 10 (in square or rectangular areas) on each dielectric layer is such that a margin is left around three sides of the dielectric while the electrode extends to the edge of the fourth side. The next electrode layer in the stack is printed such that it extends to the edge of the opposite side. The completed MLC capacitor structure is then diced into discrete MLC chips (such that each chip will have alternating internal electrodes exposed on two opposite faces as shown by lines 18 in FIG. 2) before firing. This is done in conformance with the registration of the internal electrode patterns. Dicing can be mechanized by blade cutting which requires controlling cake strength and elasticity of the MLC structure. The discrete devices are then sintered in a kiln (fired) to remove the organic binders and allow the inorganic particles to consolidate into a dense structure.

After the chip capacitors are sintered, a conductive layer is deposited on each chip to contact the exposed portions of the internal electrodes and to provide terminations 12 for electrical access to the capacitor to result in the structure shown in FIG. 1. The process that is typically used for this end termination involves first the alignment of each chip in a fixture so as to expose one of the faces having the internal electrodes. That face is then dipped (along with part of four adjacent faces) into a silver bearing ink and the process is repeated for the opposite face after which the ink is cured. This kind of termination covers all of one and part of four adjacent faces of the capacitor, requires two sequential alignment and ink dipping steps, and needs a sintering cycle.

Figure 3:
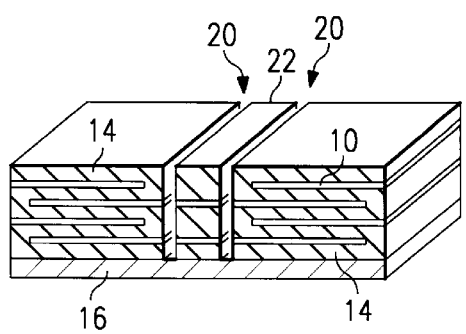
FIG. 3 Represents a cross-sectional view of a preferred embodiment of the present invention prior to filling of the termination trenches of two adjacent capacitor structures of FIG. 2.
Figure 4:
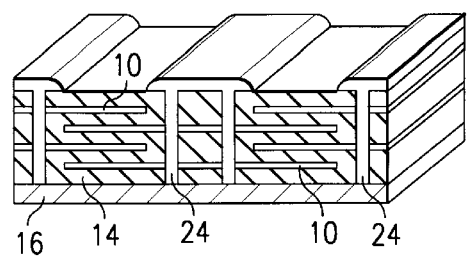
FIG. 4 Represents a cross-sectional view of a preferred embodiment of the present invention after the termination trenches are filled.
Figure 5:
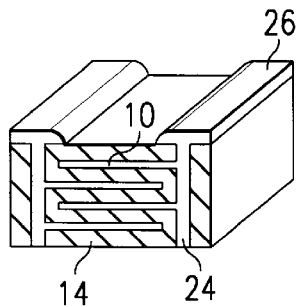
FIG. 5 Represents a finished MLC according to the present invention.

According to the present invention, an MLC capacitor is fabricated initially following the techniques of the prior art. The capacitors are formed in a structure as shown in FIG. 2 having alternating electrodes 10 separated by a dielectric 14. In the present invention, the edge terminations or termination electrodes are formed on the capacitors prior to singulation. In one embodiment, the electrode stack of FIG. 2 is cut to expose trenches 20 to the embedded electrodes as shown in FIG. 3. The trenches 20 may be made with a suitable blade technique or with other means. In this embodiment shown in FIG. 3 the trenches are made to expose electrodes for adjoining pairs of capacitors with a region 22 in between the trenches to accommodate a saw kerf during singulation. The trenches are then filled with the termination electrode material 24 using an aligned mask. The material may be deposited by an appropriate means such as doctor blade through a metal mask or by silk screen printing. After depositing the edge termination material, the capacitors appear as shown in FIG. 4. The capacitors are then singulated on the lines as shown and then sintered at an elevated temperature as is the custom of the prior art. The resulting structure for a single MLC capacitor is as shown in FIG. 5. The electrode is embedded within the ceramic material and not exposed to the surface of the structure at the end faces of the cubical capacitor. The electrode material may be exposed as an annular ring around the ends of the cubical structure but may have only one side where the electrode material 24 has a buildup of material on the face greater in width than the width of the trench to form a top electrode 26, or the electrode material 24 may be exposed on only the top side as shown in FIG. 5 but not on the remaining faces.

Figure 6A:
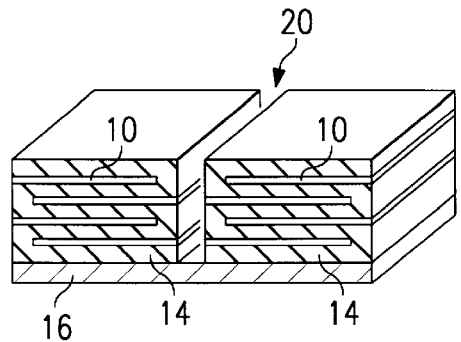
FIGS. 6a–c Represent another embodiment according to the present invention.
Figure 6B:
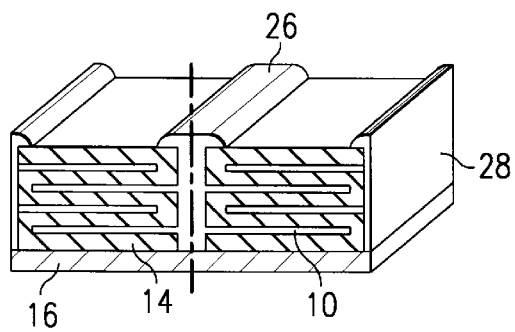
Figure 6C:
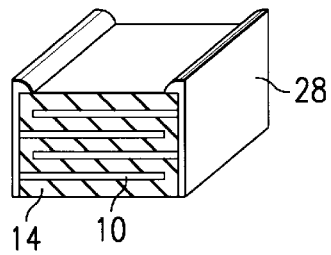

Another embodiment of the present invention is illustrated in FIGS. 6a–c. In this embodiment, a single trench 20, shown in FIG. 6a is made between each adjacent pair of capacitors while in the block state represented in FIG. 2. The width of the trench may need to accommodate a saw kerf depending on the method used for singulation. In this embodiment, two faces 28 of each MLC capacitor is entirely covered with conductive material as shown in FIGS. 6b–c. The resulting structure is similar to the prior art since it has a face electrode 28 over each end face of the capacitor but only has a peripheral electrode portion, top electrode 26, on the top face of the device which extends above the plane of the top side. In contrast, the prior art typically has a peripheral portion of the electrode on each of the four faces of the device adjacent to the end faces as represented in FIG. 1 which are formed when the device is dipped as described above.

Figure 7A:
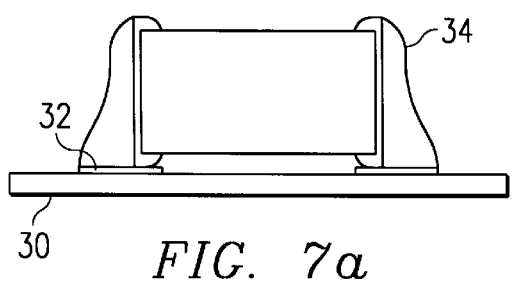
FIGS. 7a–b Represent a comparison of the bonding method according to the present invention and the prior art.
Figure 7B:
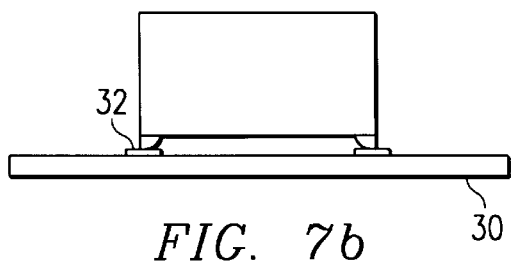

FIG. 7a–b illustrates a comparison of a MLC capacitor of the present invention bonded to a printed circuit board compared to a device of the prior art. In FIG. 7a a prior art MLC capacitor structure is shown bonded to a circuit board 30 on pads 32. The solder forms a meniscus 34 on the ends of the device which makes contact with a pad 32 on the circuit board. In FIG. 7b, the device has a top electrode 26 only on the top surface of the device and makes contact with the circuit card on a pad which lies within the outline of the device, thereby reducing the board footprint since no meniscus is formed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A Multilayer ceramic capacitor structure comprising:

(a) alternating layers of conductive and insulating material where the alternating layers of conductive material form two sets of electrodes for a capacitor;

(b) an insulating layer above and below the alternating layers to form a top and a bottom side of the capacitor structure;

(c) a first and second termination electrode with one electrode near each end of the capacitor perpendicular to the alternating layers of conductive and insulative material and connected with one set of the sets of electrodes, and (d) an external electrode associated with each termination electrode having at least a portion thereof extending above the plane of said top side and with no portion extending beyond the plane of the bottom side.

2. The structure according to claim 1, wherein the termination electrodes are embedded in a trench such that end faces of the capacitor are covered with insulative ceramic material and the termination electrodes are exposed as an annular rings.

3. The structure according to claim 1, wherein said termination electrodes are embedded in a trench such that end faces of the capacitor are covered with insulative ceramic material and the termination electrodes are not exposed except to contact said external electrodes.

4. The structure according to claim 1, wherein the insulating layer forming the top and bottom is the same material as the insulating material of the alternating layers.

* * * * *